(12) United States Patent
Wojewoda et al.

(10) Patent No.: US 7,634,596 B2
(45) Date of Patent: Dec. 15, 2009

(54) DYNAMIC PERIPHERAL FUNCTION REMAPPING TO EXTERNAL INPUT-OUTPUT CONNECTIONS OF AN INTEGRATED CIRCUIT DEVICE

(75) Inventors: Igor Wojewoda, Tempe, AZ (US); Brian Boles, Mesa, AZ (US); Steve Bradley, Phoenix, AZ (US); Gaurang Kavaiya, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 132 days.

(21) Appl. No.: 11/686,724

(22) Filed: Mar. 15, 2007

(65) Prior Publication Data

US 2007/0283052 A1  Dec. 6, 2007

Related U.S. Application Data

(60) Provisional application No. 60/803,835, filed on Jun. 2, 2006.

(51) Int. Cl.
*G06F 3/00* (2006.01)
*G06F 5/00* (2006.01)
*G06F 13/12* (2006.01)
*H04L 12/28* (2006.01)

(52) U.S. Cl. .............................. 710/51; 710/36; 710/62; 370/351

(58) Field of Classification Search ..................... 710/51
See application file for complete search history.

(56) References Cited

U.S. PATENT DOCUMENTS 5,671,433 A * 9/1997 Fung et al. ................... 712/43
5,748,982 A * 5/1998 Smith et al. ................... 710/9
5,835,405 A  11/1998 Tsui et al. ................... 365/182
6,020,760 A  2/2000 Sample et al. ................ 326/41
6,125,464 A * 9/2000 Jin .............................. 714/727
6,266,717 B1 * 7/2001 Dworkin et al. ............... 710/51
6,300,792 B1  10/2001 Pedersen ...................... 326/38

OTHER PUBLICATIONS

International Search Report and Written Opinion for PCT/US2007/070066 mailed Jan. 10, 2008.
International Preliminary Report on Patentability for PCT/US2007/070066, mailed Dec. 18, 2008.

* cited by examiner

*Primary Examiner*—Alford W Kindred
*Assistant Examiner*—Zachary K Huson
(74) *Attorney, Agent, or Firm*—King & Spalding L.L.P.

(57) ABSTRACT

Peripheral functions of an integrated circuit device may be pooled and dynamically mapped to available external input-output connections of the integrated circuit device by using a set of configuration registers. To provide system robustness, the configuration registers may implement various levels of write protection, error correction and monitoring circuitry. One or more peripheral output functions may be mapped to one or more external output connections. Not more than one output function may be active at the same time on the same output connection. Outputs and inputs may be mapped to the same external input-output connection with or without the output being controllable for placement into an inactive state, e.g., high impedance or open collector. When the input is required to receive external data over the external input-output connection, the output may be placed into the inactive state.

41 Claims, 3 Drawing Sheets

DYNAMIC PERIPHERAL FUNCTION REMAPPING TO EXTERNAL INPUT-OUTPUT CONNECTIONS OF AN INTEGRATED CIRCUIT DEVICE

RELATED PATENT APPLICATION

This application claims priority to commonly owned U.S. Provisional Patent Application Ser. No. 60/803,835; filed Jun. 2, 2006; entitled "Dynamic Peripheral Pin Remapping" by Igor Wojewoda, Brian Boles, Steve Bradley and Gaurang Kavaiya; and is hereby incorporated by reference herein for all purposes.

TECHNICAL FIELD

The present disclosure relates to coupling to peripheral functions in an integrated circuit device, and more specifically, to dynamically remapping specific input and output peripheral functions to designated external input-output connections of the integrated circuit device. The number of peripheral functions available may exceed that of the number of external input-output connections of the integrated circuit device.

BACKGROUND

With decreasing process geometries in the fabrication of integrated circuit devices, it is now possible to include many more peripheral functions in a single mask set before an integrated circuit device becomes core limited. As a result, many integrated circuit devices have more peripheral features than can be activated at any one time, based upon the availability of external input-output connections, e.g., pins, ball bumps, surface mount leads, etc., on the integrated circuit package. In the past, several peripheral functions were hardwired onto a single external connection, which limited the overall integrated circuit device flexibility. An assumption had to be made as to which features would share the same external connection.

SUMMARY

To solve this problem, an integrated circuit device, e.g., microprocessor, microcontroller, digital signal processor (DSP), programmable logic array (PLA), application specific integrated circuit (ASIC), etc., may include fully remappable peripheral functions. A set of peripheral input and output features not requiring special pad structures may be placed into a pool of remappable functions. Then using a set of registers, e.g., mapping registers, dynamic mapping of the desired peripheral functions to the available external input-output connections of the integrated circuit device may be easily achieved by a user.

It is contemplated and within the scope of this disclosure that the mapping registers may be lockable. Optionally, once the mapping registers are locked from programming they may be prevented from being programmed again. The mapping registers may comprise redundant logic, and if a data mismatch occurs in the redundant logic then the integrated circuit device may reset.

For peripheral outputs, the user may map a specific peripheral function to an external output connection. This prevents multiple output functions from being active at the same time on the same output. An output and at least one input may be mapped to the same external input-output connection as the output driver may be controllable as active or inactive, e.g., high impedance or open collector state, when the at least one input common to the output is to receive data from an external source connected to the external input-output connection. Also, some outputs may be monitored by respective inputs without having to become inactive. Some bidirectional data buses may be for example but not limited to a serial bidirectional data bus, one wire bidirectional data bus, SPI bus, I²C bus, etc.

For peripheral inputs, the user may map a specific external input connection to a peripheral function. This allows the user to map a single external input connection to as many peripheral functions (e.g., edge interrupt and SPI clock, etc.) as desired. These I/O mapping configurations may be stored in a plurality of mapping registers that may be programmed by a user. To provide system robustness, the mapping registers may implement various levels of write protection, error correction and monitoring circuitry. These additional security features may also be configured by the user depending on the system requirements.

As more peripheral functions are included in an integrated circuit device, the overall device functions become limited by the number of external input-output connections rather than the availability of the peripheral functions. Having remappable peripheral functions to external input, output and/or input-output connections allows a user to tailor and maximize the integrated circuit device features that may be available (e.g., peripheral functions) specifically to a desired application. It is contemplated and within the scope of this disclosure that more peripheral functions may be fabricated into the integrated circuit device than there are input, output and/or input-output connections available on the integrated circuit device. This allows a single peripheral feature rich integrated circuit mask set that has the capabilities for much broader market applications.

According to a specific example embodiment of this disclosure, an integrated circuit device having dynamic peripheral function to external input-output connection remapping may comprise: a plurality of peripheral functions; a plurality of mapping registers; a plurality of drivers; a plurality of receivers; a plurality of input-output external connections, wherein each one of the plurality of input-output external connections is coupled to an input of a respective one of the plurality of receivers and an output of a respective one of the plurality of drivers; a plurality of first multiplexers, each of the plurality of first multiplexers has inputs coupled to the respective ones of the plurality of receivers, an output coupled to the respective one of the plurality of peripheral functions and a control input coupled to a respective one of the plurality of mapping registers, wherein the respective one of the plurality of mapping registers controls which one of the plurality of receivers is coupled to the respective one of the plurality of peripheral functions; a plurality of second multiplexers, each of the plurality of second multiplexers has inputs coupled to the respective ones of the plurality of peripheral functions, an output coupled to a data input of the respective one of the plurality of drivers and a control input coupled to the respective one of the plurality of mapping registers, wherein the respective one of the plurality of mapping registers controls which one of the plurality of drivers is coupled to the respective one of the plurality of peripheral functions; and a plurality of third multiplexers, each of the plurality of third multiplexers has inputs coupled to the respective ones of the plurality of peripheral functions, an output coupled to a control input of the respective one of the plurality of drivers and a control input coupled to the respective one of the plurality of mapping registers, wherein the respective one of the plurality of peripheral functions controls characteristics of the respective one of the plurality of drivers.

According to another specific example embodiment of this disclosure, an integrated circuit device having dynamic peripheral function to external output connection remapping may comprise: a plurality of peripheral functions; a plurality of mapping registers; a plurality of drivers; a plurality of output external connections, wherein each one of the plurality of output external connections is coupled to an output of a respective one of the plurality of drivers; a plurality of data multiplexers, each of the plurality of data multiplexers has inputs coupled to the respective ones of the plurality of peripheral functions, an output coupled to a data input of the respective one of the plurality of drivers and a control input coupled to the respective one of the plurality of mapping registers, wherein the respective one of the plurality of mapping registers controls which one of the plurality of drivers is coupled to the respective one of the plurality of peripheral functions; and a plurality of control multiplexers, each of the plurality of control multiplexers has inputs coupled to the respective ones of the plurality of peripheral functions, an output coupled to a control input of the respective one of the plurality of drivers and a control input coupled to the respective one of the plurality of mapping registers, wherein the respective one of the plurality of peripheral functions controls characteristics of the respective one of the plurality of drivers.

According to yet another specific example embodiment of this disclosure, an integrated circuit device having dynamic peripheral function to external input connection remapping may comprise: a plurality of peripheral functions; a plurality of mapping registers; a plurality of receivers; a plurality of input external connections, wherein each one of the plurality of input external connections is coupled to an input of a respective one of the plurality of receivers; and a plurality of multiplexers, each of the plurality of multiplexers has inputs coupled to the respective ones of the plurality of receivers, an output coupled to the respective one of the plurality of peripheral functions and a control input coupled to a respective one of the plurality of mapping registers, wherein the respective one of the plurality of mapping registers controls which one of the plurality of receivers is coupled to the respective one of the plurality of peripheral functions.

BRIEF DESCRIPTION OF THE DRAWINGS

A more complete understanding of the present disclosure thereof may be acquired by referring to the following description taken in conjunction with the accompanying drawings wherein.

Figure 1:
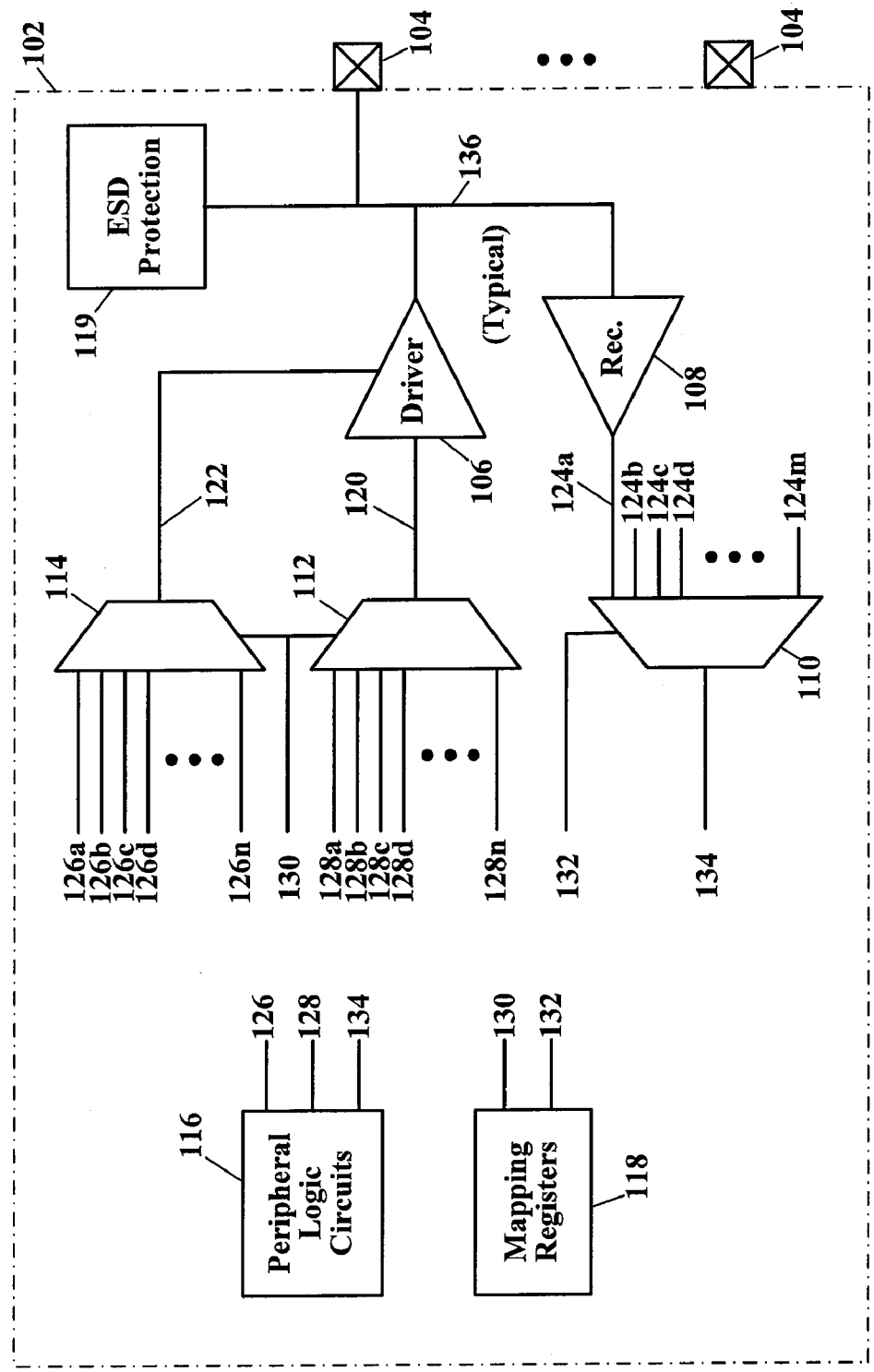
FIG. 1 illustrates a schematic block diagram of input-output (I/Os) circuits in an integrated circuit device having dynamic peripheral remapping, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of input-output (I/Os) circuits in an integrated circuit device having dynamic peripheral remapping, according to a specific example embodiment of this disclosure. An integrated circuit device 102, e.g., microprocessor, microcontroller, digital signal processor (DSP), programmable logic array (PLA), application specific integrated circuit (ASIC), etc., may be enclosed in an integrated circuit package (not shown) having a plurality of external input-output (I/O) connections 104, e.g., pins, solder ball bumps, surface mount leads, etc. Each of these plurality of external I/O connections 104 may be coupled to a respective one of a plurality of drivers 106 and a respective one of a plurality of receivers 108 through an integrated circuit device bond pad (not shown) used for connection of the integrated circuit die to the external I/O connections 104 with, for example, wire bonding and lead frame connections. In addition each of the integrated circuit bond pads (coupled to the each of the plurality of external I/O connections 104) may have electrostatic discharge (ESD) protection 119 coupled thereto.

Each of the plurality of receivers 108 may be coupled to respective inputs 124a-124m of a plurality of multiplexers 110 (only one multiplexer 110 is shown for clarity). An output 134 from each of the plurality of multiplexers 110 may be coupled to an input of a respective one of a plurality of peripheral functions 116, e.g., clock input, timer reset, counter input, etc. Each of the plurality of multiplexers 110 may be controlled, e.g., an input selected for coupling to the output of the multiplexer 110 by a control signal 132 from a respective one of a plurality of mapping registers 118. For example, at least one peripheral input may be coupled to one or more of the plurality of receivers 108, and/or one or more peripheral inputs may be coupled to more than one of the plurality of receivers 108.

Each of the plurality of multiplexers 110 may have m inputs, e.g., matching the number of receivers 108, and an output. The control signal 132 may be sent on a binary parallel or serial bus and have a sufficient number of bits for control of the m inputs. It is contemplated and with the scope of this disclosure that instead of using the plurality of multiplexers 110 for coupling each of the plurality of receivers 108 to respective ones of the plurality of peripheral inputs, that an input switching matrix circuit (not shown) may be used to couple the outputs from any one or more of the plurality of receivers 108 to any one or more of the plurality of peripheral inputs. The input switching matrix (not shown) may be used to couple any one or more of the plurality of receivers 108 to any one or more of the plurality of peripheral inputs by using the control signals 132 from the plurality of mapping registers 118.

Each of the plurality of drivers 106 may be coupled to respective outputs 120 of a plurality of multiplexers 112 (only one multiplexer 112 is shown for clarity). Each of a plurality of inputs 128 of the plurality of multiplexers 112 may be coupled to an output of a respective one of a plurality of peripheral functions 116, e.g., clock output, timer reset out, counter output, etc. Each of the plurality of multiplexers 112 may be controlled, e.g., an input selected for coupling to the output of the multiplexer 112 by a control signal 130 from a respective one of a plurality of mapping registers 118. In addition, control signals 122 to each of the plurality of drivers 106 may be used to control operation and/or characteristics of the respective driver 106 in an active or inactive state, e.g., open collector, active pull-up, active pull-down, or tri-state having active logic high and active logic low with a high impedance third state. Selection of the pull-up or pull-down resistance value, slew rate, drive capabilities, etc., for the drivers 106 may also be configured. These configurations may be performed by firmware in the integrated circuit device 102 and/or external program software having access to and configuration permission for the integrated circuit device 102.

Each of the control signals 122 coupled to a respective one of the plurality of drivers 106 may be coupled to a control signal output from a respective one of the plurality of peripheral functions 116 through respective ones of a plurality of multiplexers 114. Each of the plurality of multiplexers 112 and 114 may have n inputs, e.g., matching the number of the plurality of peripheral functions 116 data and control outputs 128 and 126, respectively. The control signals 130 to the plurality of multiplexers 112 and 114 may be sent on binary parallel or serial buses and have a sufficient number of bits for control of the n inputs.

It is contemplated and with the scope of this disclosure that instead of using the plurality of multiplexers 112 and 114 for coupling each of the plurality of drivers 106 to respective outputs of the plurality of peripherals 116, that a switching matrix circuit (not shown) may be used to couple the inputs of the plurality of drivers 106 to respective outputs of the plurality of peripheral functions 116. For example, one or more drivers 106 may be coupled to an output of a peripheral functions 116, however, not more than one output of a peripheral function 116 may be active at a time. This prevents multiple output functions from becoming active at the same time, but allows multiple drivers 106 to have the same data information available for a plurality of external circuits (load fanout sharing) and/or increased drive capabilities for a particular load.

Figure 2:
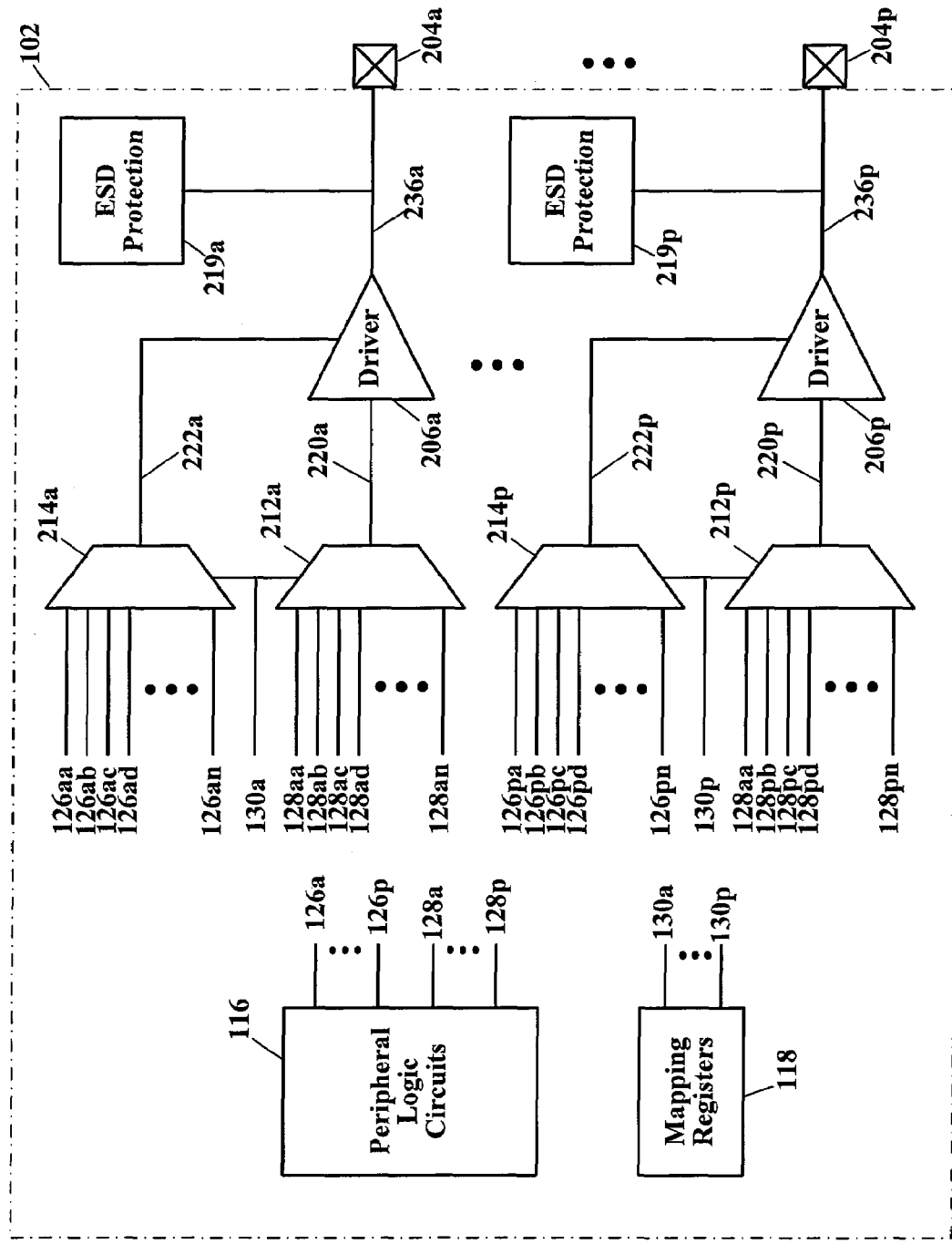
FIG. 2 illustrates a schematic block diagram of output circuits in an integrated circuit device having dynamic peripheral remapping, according to another specific example embodiment of this disclosure.

Referring to FIG. 2, depicted is a schematic block diagram of output circuits in an integrated circuit device having dynamic peripheral remapping, according to another specific example embodiment of this disclosure. An integrated circuit device 102, e.g., microprocessor, microcontroller, digital signal processor (DSP), programmable logic array (PLA), application specific integrated circuit (ASIC), etc., may be enclosed in an integrated circuit package (not shown) having a plurality of external output connections 204, e.g., pins, ball bumps, surface mount leads, etc. Each of these plurality of external out connections 204 may be coupled to a respective one of a plurality of drivers 206 through an integrated circuit device bond pad (not shown) used for connection of the integrated circuit die to the external output connections 204 with, for example, wire bonding and lead frame connections. In addition each of the integrated circuit bond pads (coupled to the each of the plurality of external output connections 204) may have electrostatic discharge (ESD) protection 219 coupled thereto.

Each of the plurality of drivers 206a-206p may be coupled to respective outputs 220a-220p of a plurality of multiplexers 212a-212p. Each of a plurality of inputs 128 of the plurality of multiplexers 212a-212p may be coupled to an output of a respective one of a plurality of peripheral functions 116, e.g., clock output, timer reset out, counter output, etc. Each of the plurality of multiplexers 212a-212p may be controlled, e.g., an input selected for coupling to the output of the multiplexers 212a-212p by control signals 130a-130p from a respective one of a plurality of mapping registers 118. In addition, control signals 222a-222p to respective ones of the plurality of drivers 206a-206p may be used to control operation thereof in an active or inactive state, e.g., open collector, active pull-up, active pull-down, or tri-state having active logic high and active logic low with a high impedance third state. Selection of the pull-up or pull-down resistance value, slew rate, drive capabilities, etc., for the drivers 206 may also be configured. These configurations may be performed by firmware in the integrated circuit device 102 and/or external program software having access to and configuration permission for the integrated circuit device 102.

Each of the control signals 222a-222p coupled to a respective one of the plurality of drivers 206a-206p, respectively, may be coupled to control signal outputs from respective ones of the plurality of peripheral functions 116 through respective ones of a plurality of multiplexers 214a-214p. Each of the plurality of multiplexers 212 and 214 may have n inputs, e.g., matching the number of the plurality of peripheral functions 116 data and control outputs 128 and 126, respectively. The control signals 130a-130p to the plurality of multiplexers 212a-212p and 214a-214p may be sent on binary parallel or serial buses and have a sufficient number of bits for control of the n inputs.

It is contemplated and with the scope of this disclosure that instead of using the plurality of multiplexers 212a-212p and 214a-214p for coupling each of the plurality of drivers 206a-206p to respective outputs of the plurality of peripheral functions 116, that a switching matrix circuit (not shown) may be used to couple the inputs of the plurality of drivers 206a-206p to respective outputs of the plurality of peripheral functions 116. For example, one or more drivers 206 may be coupled to an output of a peripheral function 116, however, not more than one output of a peripheral function 116 may be couple to any one or more drivers 206. This prevents multiple output functions from becoming active at the same time, but allows multiple drivers 206 to have the same data information available for a plurality of external circuits (load fanout sharing) and/or increased drive capabilities for a particular load.

Figure 3:
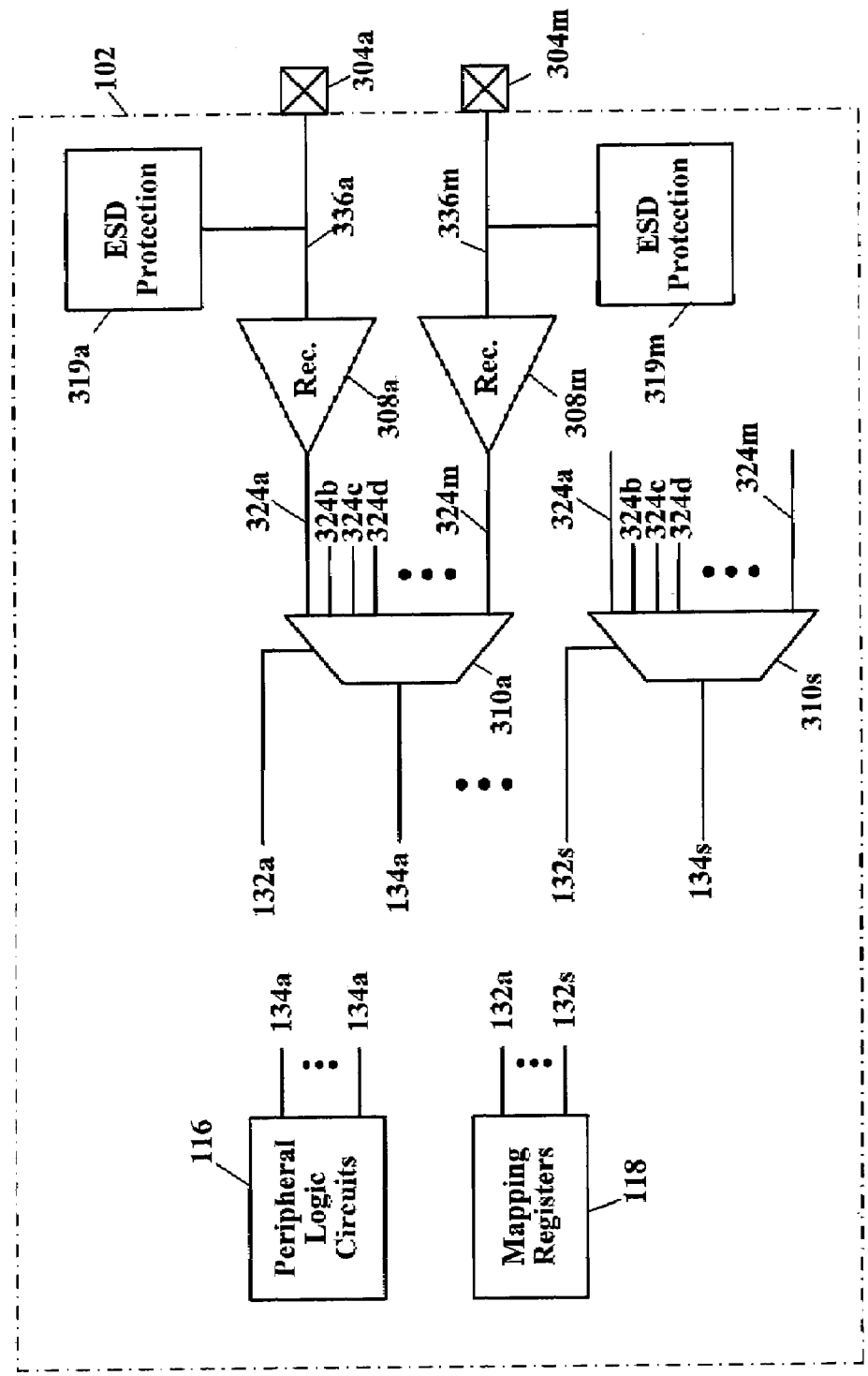
FIG. 3 illustrates a schematic block diagram of input circuits in an integrated circuit device having dynamic peripheral remapping, according to yet another specific example embodiment of this disclosure.

Referring to FIG. 3, depicted is a schematic block diagram of input circuits in an integrated circuit device having dynamic peripheral remapping, according to yet another specific example embodiment of this disclosure. An integrated circuit device 102, e.g., microprocessor, microcontroller, digital signal processor (DSP), programmable logic array (PLA), application specific integrated circuit (ASIC), etc., may be enclosed in an integrated circuit package (not shown) having a plurality of external input connections 304, e.g., pins, ball bumps, surface mount leads, etc. Each of these plurality of external input connections 304 may be coupled to a respective one of a plurality of receivers 308 through an integrated circuit device bond pad (not shown) used for connection of the integrated circuit die to the external input connections 304 with, for example, wire bonding and lead frame connections. In addition each of the integrated circuit bond pads (coupled to the each of the plurality of external input connections 304) may have electrostatic discharge (ESD) protection 319 coupled thereto.

Each of the plurality of receivers 308a-308m may be coupled to respective inputs 324a-324m of a plurality of multiplexers 310a-310s. Outputs 134a-134s from the plurality of multiplexers 310a-310s, respectively, may be coupled to respective inputs of a plurality of peripheral functions 116, e.g., clock input, timer reset, counter input, etc. Each of the plurality of multiplexers 310a-310s may be controlled, e.g., an input selected for coupling to the output of the plurality of multiplexers 310a-310s by control signals 132a-132s from respective ones of a plurality of mapping registers 118. Each of the plurality of multiplexers 310a-310s may have m inputs, e.g., matching the number of receivers 308a-308m, and an output. The control signals 132a-132s may be sent on binary parallel or serial buses and have a sufficient number of bits for control of the m inputs.

It is contemplated and with the scope of this disclosure that instead of using the plurality of multiplexers 310a-310s for coupling each of the plurality of receivers 308a-308m to respective inputs of the plurality of peripherals 116, that a switching matrix circuit (not shown) may be used to couple the outputs from any one or more of the plurality of receivers 308a-308m to any one or more inputs of the plurality of peripheral functions 116 by using the control signals 132a-132s from the plurality of mapping registers 118. For example, at least one input of the plurality of peripheral functions 116 may be coupled to one or more of the plurality of receivers 308a-308m, and/or one or more peripheral inputs may be coupled to more than one of the plurality of receivers 308a-308m.

The I/O mapping configurations stored in the plurality of mapping registers 118 may be programmed by a user. The plurality of mapping registers 118 may be locked, may be writable only when unlocked, may be implemented in redundant logic with a mismatch causing a device reset, and/or the register lock may be configured to be one-way only, e.g., once locked it cannot be unlocked again. The mapping registers may be non-volatile memory.

The integrated circuit device 102 may comprise more peripherals 116 than there are external input connections 304, external output connections 204, and/or external I/O connections 104. This allows a user greater flexibility in applying the integrated circuit device 102 to a desired application. It also allows the integrated circuit device 102 to be used for applications in a much broader market, thus increasing demand and lowering costs for a mass produced peripheral feature rich product having configuration flexibility for both the types of peripherals selected and the external connection mapping of the selected peripherals.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device having dynamic peripheral function to external input-output connection remapping, comprising:
   a plurality of peripheral functions;
   a plurality of mapping registers;
   a plurality of drivers;
   a plurality of receivers;
   a plurality of external input-output connections, wherein each one of the plurality of external input-output connections is coupled to an input of a respective one of the plurality of receivers and an output of a respective one of the plurality of drivers;
   a plurality of first multiplexers, each of the plurality of first multiplexers has a plurality of inputs, an output and a control input, wherein each input of the plurality of first multiplexers is coupled to an output of a respective one of the plurality of receivers, each output of the plurality of first multiplexers is coupled to a respective input of the plurality of peripheral functions and each control input of the plurality of first multiplexers is coupled to a respective one of the plurality of mapping registers, wherein the plurality of mapping registers control what outputs of the plurality of receivers are coupled to which inputs of the plurality of peripheral functions;
   a plurality of second multiplexers, each of the plurality of second multiplexers has a plurality of inputs, an output and a control input, wherein each input of the plurality of second multiplexers is coupled to a data output of a respective one of the plurality of peripheral functions, each output of the plurality of second multiplexers is coupled to a data input of a respective one of the plurality of drivers and each control input of the plurality of second multiplexers is coupled to a respective one of the plurality of mapping registers, wherein the plurality of mapping registers control what inputs of the plurality of drivers are coupled to which data outputs of the plurality of peripheral functions; and
   a plurality of third multiplexers, each of the plurality of third multiplexers has a plurality of inputs, an output and a control input, wherein each input of the plurality of third multiplexers is coupled to a control output of a respective one of the plurality of peripheral functions, each output of the plurality of third multiplexers is coupled to a control input of a respective one of the plurality of drivers and each control input of the plurality of third multiplexers is coupled to a respective one of the plurality of mapping registers, wherein the plurality of mapping registers control what outputs of the plurality of peripheral functions control operating characteristics of the plurality of drivers.

2. The integrated circuit device according to claim 1, further comprising electrostatic discharge protection coupled to each one of the plurality of external input-output connections.

3. The integrated circuit device according to claim 1, wherein the operating characteristics of the plurality of drivers are selected from the group consisting of active state and inactive state.

4. The integrated circuit device according to claim 1, wherein the operating characteristics of the plurality of drivers are selected from the group consisting of open collector, active pull-up, active pull-down, and tri-state.

5. The integrated circuit device according to claim 4, wherein the tri-state operating characteristics of the plurality of drivers are selected from the group consisting of active logic high, active logic low, and high impedance.

6. The integrated circuit device according to claim 1, wherein the operating characteristics of the plurality of drivers are selected from the group consisting of pull-up resistance value, pull-down resistance value, slew rate, and drive capabilities.

7. The integrated circuit device according to claim 1, wherein the integrated circuit device is selected from the group consisting of microprocessor, microcontroller, digital signal processor (DSP), programmable logic array (PLA), and application specific integrated circuit (ASIC).

8. The integrated circuit device according to claim 1, wherein the plurality of first, second and third multiplexers comprise a switching matrix circuit.

9. The integrated circuit device according to claim 1, wherein the plurality of mapping registers are non-volatile.

10. The integrated circuit device according to claim 1, wherein the plurality of mapping registers are programmable.

11. The integrated circuit device according to claim 10, wherein the programming of the plurality of mapping registers is lockable.

12. The integrated circuit device according to claim 11, wherein once the plurality of mapping registers are locked from programming the plurality of mapping registers cannot be programmed again.

13. The integrated circuit device according to claim 1, wherein the plurality of mapping registers comprise redundant logic.

14. The integrated circuit device according to claim 13, wherein when a data mismatch occurs in the redundant logic the integrated circuit device resets.

15. An integrated circuit device having dynamic peripheral function to external output connection remapping, comprising:
a plurality of peripheral functions;
a plurality of mapping registers;
a plurality of drivers;
a plurality of external output connections, wherein each one of the plurality of external output connections is coupled to an output of a respective one of the plurality of drivers;
a plurality of data multiplexers, each of the plurality of data multiplexers has a plurality of inputs, an output and a control input, wherein each input of the plurality of data multiplexers is coupled to a data output of a respective one of the plurality of peripheral functions, each output of the plurality of data multiplexers is coupled to a data input of a respective one of the plurality of drivers and each control input of the plurality of data multiplexers is coupled to a respective one of the plurality of mapping registers, wherein the plurality of mapping registers control what inputs of the plurality of drivers are coupled to which data outputs of the plurality of peripheral functions; and
a plurality of control multiplexers, each of the plurality of control multiplexers has a plurality of inputs, an output and a control input, wherein each input of the plurality of control multiplexers is coupled to a control output of a respective one of the plurality of peripheral functions, each output of the plurality of control multiplexers is coupled to a control input of a respective one of the plurality of drivers and each control input of the plurality of control multiplexers is coupled to a respective one of the plurality of mapping registers, wherein the plurality of mapping registers control what outputs of the plurality of peripheral functions control operating characteristics of the plurality of drivers.

16. The integrated circuit device according to claim 15, further comprising electrostatic discharge protection coupled to each one of the plurality of output external connections.

17. The integrated circuit device according to claim 15, wherein the operating characteristics of the plurality of drivers are selected from the group consisting of active state and inactive state.

18. The integrated circuit device according to claim 15, wherein the operating characteristics of the plurality of drivers are selected from the group consisting of open collector, active pull-up, active pull-down, and tri-state.

19. The integrated circuit device according to claim 18, wherein the tri-state operating characteristics of the plurality of drivers are selected from the group consisting of active logic high, active logic low, and high impedance.

20. The integrated circuit device according to claim 15, wherein the operating characteristics of the plurality of drivers are selected from the group consisting of pull-up resistance value, pull-down resistance value, slew rate, and drive capabilities.

21. The integrated circuit device according to claim 15, wherein the integrated circuit is selected from the group consisting of microprocessor, microcontroller, digital signal processor (DSP), programmable logic array (PLA), and application specific integrated circuit (ASIC).

22. The integrated circuit device according to claim 15, wherein the plurality of data and control multiplexers comprise a switching matrix circuit.

23. The integrated circuit device according to claim 15, wherein the plurality of mapping registers are non-volatile.

24. The integrated circuit device according to claim 15, wherein the plurality of mapping registers are programmable.

25. The integrated circuit device according to claim 24, wherein the programming of the plurality of mapping registers is lockable.

26. The integrated circuit device according to claim 25, wherein once the plurality of mapping registers are locked from programming the plurality of mapping registers cannot be programmed again.

27. The integrated circuit device according to claim 15, wherein the plurality of mapping registers comprise redundant logic.

28. The integrated circuit device according to claim 27, wherein when a data mismatch occurs in the redundant logic the integrated circuit device resets.

29. An integrated circuit device having dynamic peripheral function to external input connection remapping, comprising:
a plurality of peripheral functions;
a plurality of mapping registers;
a plurality of receivers;
a plurality of external input connections, wherein each one of the plurality of external input connections is coupled to an input of a respective one of the plurality of receivers; and
a plurality of multiplexers, each of the plurality of multiplexers has a plurality of inputs, an output and a control input, wherein each input of the plurality of multiplexers is coupled to an output of a respective one of the plurality of receivers, each output of the plurality of multiplexers is coupled to a respective input of the plurality of peripheral functions and each control input of the plurality of multiplexers is coupled to a respective one of the plurality of mapping registers, wherein the plurality of mapping registers control what outputs of the plurality of receivers are coupled to which inputs of the plurality of peripheral functions.

30. The integrated circuit device according to claim 29, further comprising electrostatic discharge protection coupled to each one of the plurality of input external connections.

31. The integrated circuit device according to claim 29, wherein the integrated circuit device is selected from the group consisting of microprocessor, microcontroller, digital signal processor (DSP), programmable logic array (PLA), and application specific integrated circuit (ASIC).

32. The integrated circuit device according to claim 29, wherein the plurality of multiplexers comprise a switching matrix circuit.

33. The integrated circuit device according to claim 29, wherein the plurality of mapping registers are non-volatile.

34. The integrated circuit device according to claim 29, wherein the plurality of mapping registers are programmable.

35. The integrated circuit device according to claim 34, wherein the programming of the plurality of mapping registers is lockable.

36. The integrated circuit device according to claim 35, wherein once the plurality of mapping registers are locked from programming the plurality of mapping registers cannot be programmed again.

37. The integrated circuit device according to claim 29, wherein the plurality of mapping registers comprise redundant logic.

38. The integrated circuit device according to claim 37, wherein when a data mismatch occurs in the redundant logic the integrated circuit device resets.

39. The integrated circuit device according to claim 1, wherein the plurality of peripheral functions are greater in number than the plurality of external input-output connections, whereby only some of the plurality of peripheral functions are coupled to the plurality of input-output connections through the plurality of first and second multiplexers, the plurality of receivers and the plurality of drivers.

40. The integrated circuit device according to claim 15, wherein the plurality of peripheral functions are greater in number than the plurality of external output connections, whereby only some of the plurality of peripheral functions are coupled to the plurality of output external connections through the plurality of data multiplexers and the plurality of drivers.

41. The integrated circuit device according to claim 29, wherein the plurality of peripheral functions are greater in number than the plurality of external input connections, whereby only some of the plurality of peripheral functions are coupled to the plurality of input external connections through the plurality of multiplexers and the plurality of receivers.

* * * * *